United States Patent
Gauthier et al.

(10) Patent No.: US 6,894,528 B2
(45) Date of Patent: May 17, 2005

(54) PROCESS MONITOR BASED KEEPER SCHEME FOR DYNAMIC CIRCUITS

(75) Inventors: Claude R. Gauthier, Cupertino, CA (US); Shaishav A. Desai, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 231 days.

(21) Appl. No.: 10/246,336

(22) Filed: Sep. 17, 2002

(65) Prior Publication Data

US 2004/0051562 A1 Mar. 18, 2004

(51) Int. Cl.⁷ .............................................. H03K 19/00
(52) U.S. Cl. .............................. 326/16; 326/95; 326/98
(58) Field of Search ................ 326/16, 26–28, 326/95–98

(56) References Cited

U.S. PATENT DOCUMENTS 6,002,292 A  * 12/1999  Allen et al. .................. 327/379
6,690,604 B2 *  2/2004  Hsu et al. ............... 365/189.05

* cited by examiner

*Primary Examiner*—Anh Q. Tran
(74) *Attorney, Agent, or Firm*—Martine Penilla & Gencarella, LLP

(57) ABSTRACT

An invention is disclosed for a process monitor based keeper scheme for dynamic circuits. A semiconductor die having a process monitor based keeper scheme of the embodiments of the present invention generally includes a plurality of dynamic circuits, each having an adaptive keeper circuit capable of being adjusted based on a bit code. In addition, a plurality of process monitors is included. Each process monitor is disposed within a corresponding die block, which defines a local area of the die. The process monitors are capable of detecting process corner data for the corresponding die block. In communication with each process monitor and the plurality of dynamic circuits is a test processor unit. The test processor unit obtains process corner data for each die block from the process monitor disposed within the die block, and provides a bit code based on the process corner data to the dynamic circuits disposed within the die block.

12 Claims, 7 Drawing Sheets

PROCESS MONITOR BASED KEEPER SCHEME FOR DYNAMIC CIRCUITS

CROSS REFERENCE TO RELATED APPLICATIONS

This application is related to U.S. patent application Ser. No. 10/246,307, filed Sep. 17, 2002, and entitled "Adaptive Keeper Sizing For Dynamic Circuits Based on Fused Process Corner Data," which is incorporated herein by reference.

BACKGROUND OF THE INVENTION

1. Field of the Invention

This invention relates generally to keeper circuits, and more particularly to adaptive keeper transistor sizing for dynamic circuits based on local process corner data.

2. Description of the Related Art

Conventionally, keeper circuits have been utilized in dynamic circuits to prevent leaking at an internal dynamic node. For example, dynamic wide OR circuits commonly utilized in large register files often use keeper circuits to prevent unintentional discharging of the internal dynamic node, as illustrated in FIG. 1.

FIG. 1 is a schematic diagram showing a conventional dynamic wide OR circuit 100. The dynamic wide OR circuit 100 includes a precharge p-channel transistor 102, having a first terminal coupled to $V_{DD}$, a second terminal coupled to an internal dynamic node 110, and a gate coupled to a clock signal 108. In addition, a plurality of evaluation transistors 104a–104c is included in the dynamic wide OR circuit 100. Each evaluation transistor 104a–104c includes a first terminal coupled to the internal dynamic node 110 and a second terminal coupled to a first terminal of transistor 106. In addition, the gate of each evaluation transistor 104a–104c is coupled to an input $In_0$, $In_1$, and $In_2$, respectively. A second terminal of transistor 106 is coupled to ground and the gate of transistor 106 is coupled to the clock signal 108. Although FIG. 1 illustrates an OR circuit, it should be noted that the evaluation transistors can be configured to form any logic circuit as desired by the circuit developer.

The conventional dynamic wide OR circuit 100 operates in two phases, namely, a precharge phase and an evaluation phase. During the precharge phase the clock signal 108 is LOW. Hence, transistor 106 is OFF and the precharge transistor 102 is ON, which allows current to flow from $V_{DD}$ to the internal dynamic node 110. As a result, a precharge is provided to the internal dynamic node 110, which goes HIGH. Because transistor 106 is OFF, the internal dynamic node 110 stays high during the precharge phase regardless of the state of the evaluation transistors 104a–104c.

During the evaluation phase the clock signal 108 is HIGH. Hence, transistor 106 is ON and the precharge transistor 102 is OFF, which allows current to flow from the internal dynamic node 110 to ground based on the state of the evaluation transistors 104a–104c. The state of each evaluation transistor 104a–104c depends on the state of the input $In_0$, $In_1$, and $In_2$ coupled to the gate of the particular evaluation transistor 104a–104c. As can be seen in the example of FIG. 1, when the input $In_0$, $In_1$, and $In_2$ of any evaluation transistor 104a–104c is HIGH, the evaluation transistor 104a–104c turns ON and allows current to flow from the internal dynamic node 110 to ground through transistor 106. As a result, the output 112 will be LOW.

However, when all the inputs $In_0$, $In_1$, and $In_2$ of the evaluation transistors 104a–104c are LOW, all the evaluation transistors 104a–104c are OFF and the internal dynamic node 110 is allowed to stay HIGH, resulting in a HIGH at the output 112. Unfortunately, the evaluation transistors 104a–104c leak. That is, each evaluation transistor 104a–104c allows a small amount of leakage current to flow to ground through transistor 106 when the evaluation transistor 104a–104c is OFF. Thus, when all the inputs $In_0$, $In_1$, and $In_2$ of the evaluation transistors 104a–104c are LOW, a leakage current is still allowed to flow from the internal dynamic node 110 to ground though transistor 106. Thus, the voltage on the internal dynamic node 110 falls over time.

To combat the leakage current, keeper circuits 114 are utilized. The conventional keeper circuit 114 includes an inverter 118 having an input coupled to the internal dynamic node 110 and an output coupled to the gate of a keeper transistor 116. The keeper transistor 116 includes a first terminal coupled to $V_{DD}$ and a second terminal coupled to the internal dynamic node 110.

The keeper circuit 114 is primarily utilized to address leakage by keeping the internal dynamic node 110 HIGH when all the evaluation transistors 104a–104c are OFF. In particular, when the internal dynamic node 110 is HIGH, the input of the inverter 118 is HIGH, resulting in a LOW at the output of the inverter 118. The LOW at the output of the inverter 118 turns ON the keeper transistor 116, which allows current to flow into the internal dynamic node 110 from $V_{DD}$.

On the other hand, when the internal dynamic node is LOW, because of an evaluation transistor 104a–104c being ON, the keeper circuit 114 turns OFF. Specifically, when the internal dynamic node 110 is LOW, the input of the inverter 118 is LOW, resulting in a HIGH at the output of the inverter 118. The HIGH at the output of the inverter 118 turns OFF the keeper transistor 116, which prevents current from flowing into the internal dynamic node 110 from $V_{DD}$.

The leakage current is proportional to the size and number of evaluation devices 104a–104c present in the circuit. Hence, the size of the keeper transistor 116 is selected based on the size and number of evaluation devices 104a–104c present in the circuit, generally, at the worst case for leakage for expected process, voltage, and temperature. It should be noted that the keeper transistor 116 cannot be made arbitrarily large because the keeper transistor circuit 114 will adversely affect evaluation performance if the keeper transistor 116 is too large. In particular, if the keeper transistor 116 is too large, the keeper transistor 116 will try to keep the internal dynamic node 110 HIGH when the evaluation transistors attempt to discharge the internal dynamic node 110. As a result, the evaluation time can be increased and/or the value of the precharged internal dynamic node 110 may not change when an evaluation transistor is ON.

Unfortunately, this also imposes a limit on the number of evaluation devices that can be included in a conventional dynamic circuit. Increasing the number of evaluation transistors in a dynamic circuit increases the amount of leakage current proportionally. As a result, larger keeper transistors 116 are required. However, at some point, the size of keeper transistor 116 becomes too large for a single evaluation transistor 104l–104c to overcome and pull the internal dynamic node 110 LOW. This point becomes the limit to the number of evaluation devices that can be included in the dynamic circuit. Thus, the size of the keeper transistor is conventionally selected based on this limit and the worst-case leakage corner. It is desirable to remove this constraint from the design.

In view of the foregoing, there is a need for a keeper circuit design that allows the effective size of the keeper transistor to be changed based on the individual properties of the chip. The keeper circuits should adjust the effective keeper transistor size based on the requirements of the overall circuit, such as electrical characteristics of the transistors utilized in the circuit. As a result, larger dynamic circuits could be utilized, potentially improving the speed of the microprocessor itself.

SUMMARY OF THE INVENTION

Broadly speaking, the present invention fills these needs by providing a process monitor based keeper scheme for dynamic circuits. Broadly speaking, embodiments of the present invention adjust the effective keeper transistor size by enabling additional keeper transistors based on the characteristics of the particular dynamic circuit. In one embodiment, a semiconductor die having adaptive keeper logic is disclosed. The semiconductor die includes a plurality of dynamic circuits, each including an adaptive keeper circuit capable of being adjusted based on a bit code. A plurality of process monitors also is included. Each process monitor is disposed within a corresponding die block, which defines a local area of the die. The process monitors are capable of detecting process corner data for the corresponding die block. Further included in the semiconductor die is a test processor unit, which is in communication with each process monitor and the plurality of dynamic circuits. The test processor unit obtains process corner data for each die block from the process monitor disposed within the die block, and provides a bit code based on the process corner data to the dynamic circuits disposed within the die block.

An adaptive keeper circuit is disclosed in an additional embodiment. The adaptive keeper circuit is disposed within a die block that defines a local area of a die, and includes a first keeper transistor that has a first terminal in electrical communication with a power supply and a second terminal in electrical communication with an internal dynamic node. In addition, the adaptive keeper circuit includes a second keeper transistor configured in parallel to the first keeper transistor. The second keeper transistor includes a first terminal in electrical communication with the power supply. Further, a feedback bit line is included that is configured to control current flow between the second keeper transistor and the internal dynamic node. The bit line control is based on a state of the feedback bit line, which is based on a process corner characteristic the die block.

A method for optimizing a keeper circuit for use in a dynamic circuit is disclosed in a further embodiment of the present invention. The method includes defining a plurality of die blocks that define a local area of the die. In addition, process corner data is obtained for each die block and translated into a corresponding bit code that indicates a process corner of the die block. In this manner, particular secondary keeper transistors can be selected and added to a first keeper transistor using the bit code. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a process monitor based keeper scheme for dynamic circuits. Broadly speaking, embodiments of the present invention adjust the effective keeper transistor size by enabling additional keeper transistors based on the characteristics of the particular dynamic circuit (i.e., Process corner). As described in greater detail below, these characteristics are determined using a process monitor that uses on-chip oscillators to derive the local process speed. The process speed is converted to a digital word using counters and provided to the dynamic circuits of the chip. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

As mentioned above, embodiments of the present invention adjust the effective size of the keeper transistor according to the process conditions of the die. For example, at faster process corners the leakage current of the pull down transistors is high. As a result, embodiments of the present invention increase the strength of the keeper transistor to prevent unintentional discharging of the internal dynamic node. However, at nominal process corners, the leakage current of the pull down transistors generally is lower than at faster process corners. Hence, the keeper size is reduced to allow faster operation at normal conditions. In this manner, embodiments of the present invention allow wider and faster dynamic OR circuits, thereby enabling faster microprocessor operation.

Figure 1:
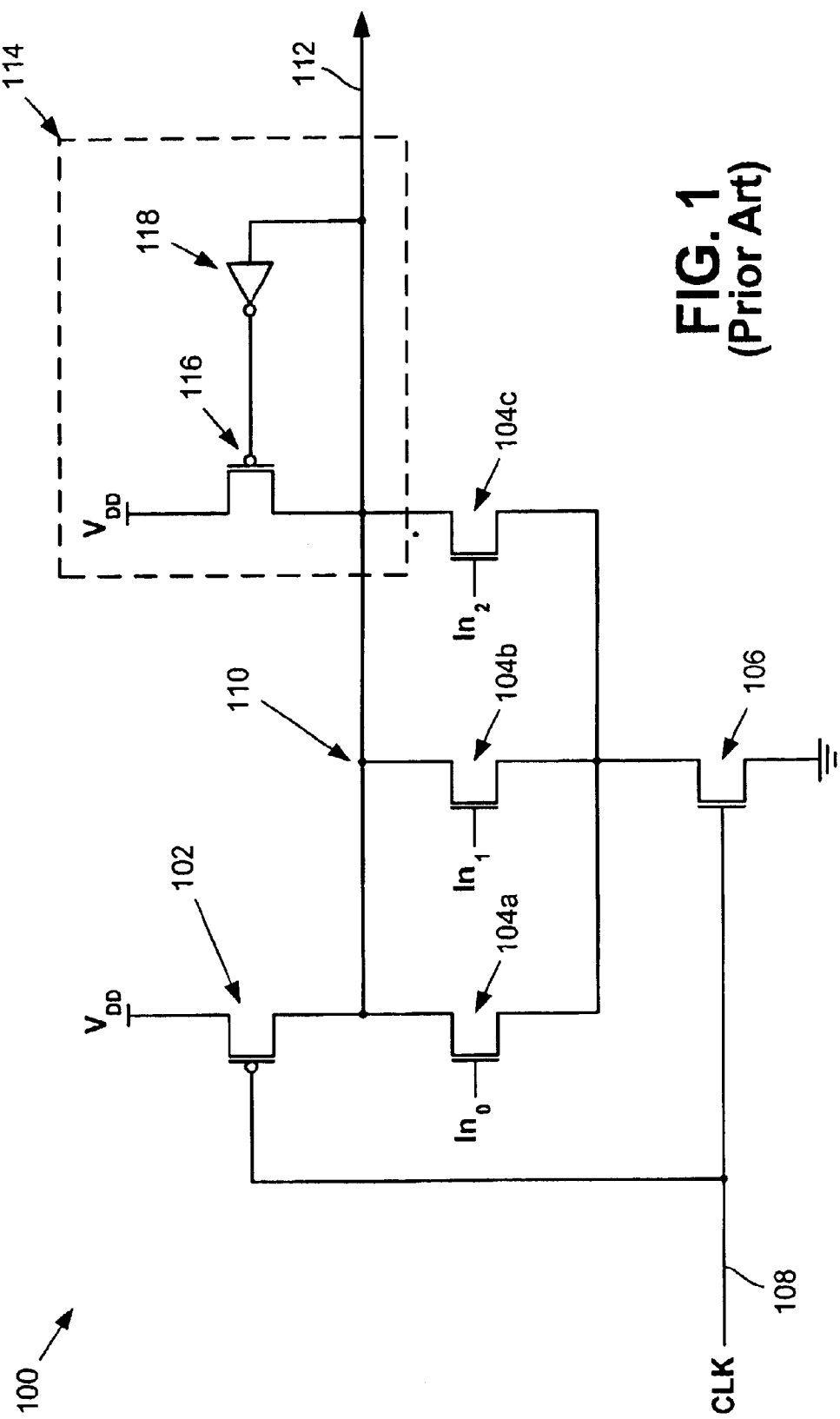
FIG. 1 is a schematic diagram showing a conventional dynamic wide OR circuit.
Figure 2:
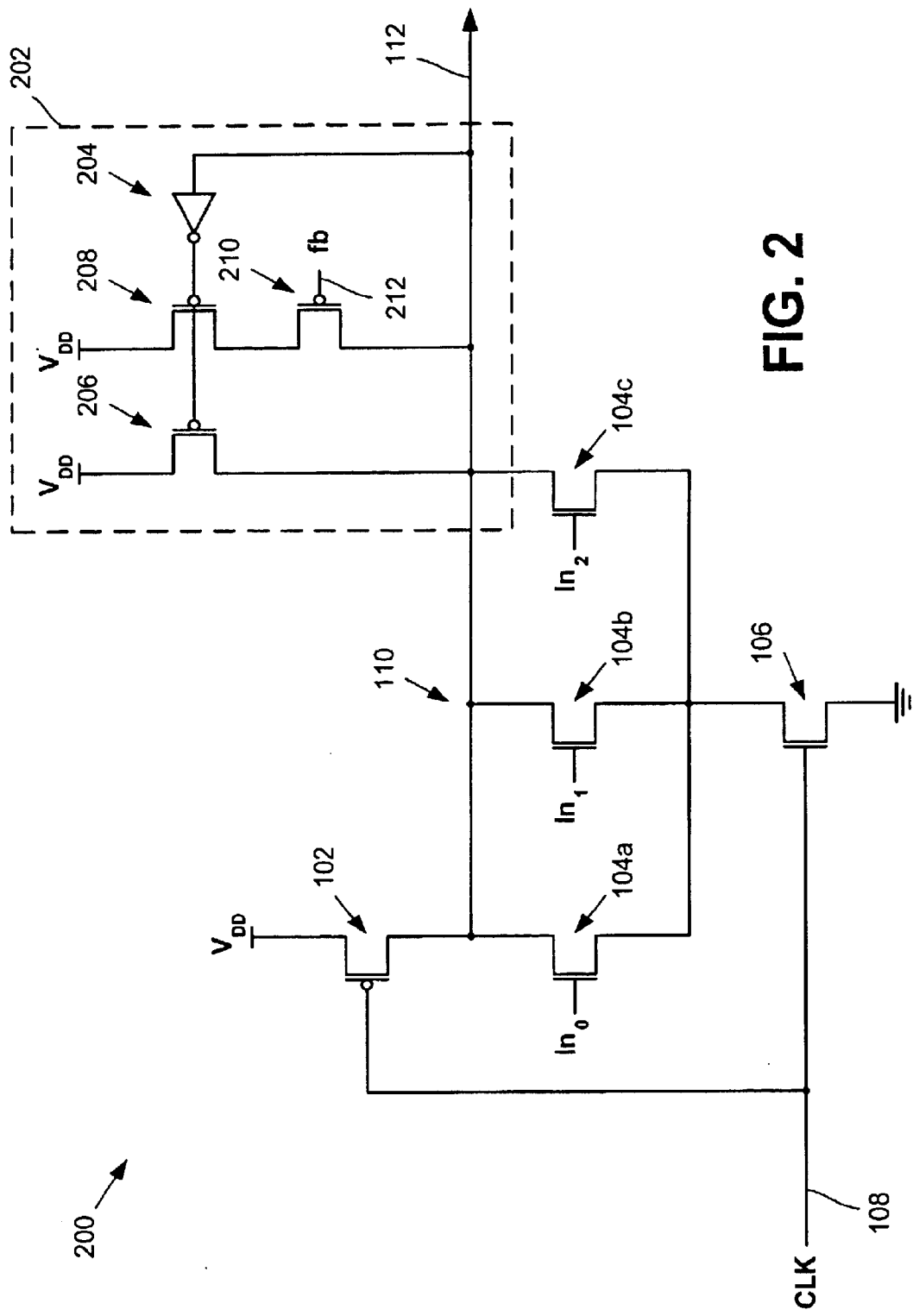
FIG. 2 is a schematic diagram showing an exemplary dynamic wide OR circuit, in accordance with an embodiment of the present invention.

FIG. 2 is a schematic diagram showing an exemplary dynamic wide OR circuit 200, in accordance with an embodiment of the present invention. The dynamic wide OR circuit 200 includes a precharge p-channel transistor 102, having a first terminal coupled to $V_{DD}$, a second terminal coupled to an internal dynamic node 110, and a gate coupled to a clock signal 108. In addition, a plurality of evaluation transistors 104a–104c is included. Each evaluation transistor 104a–104c includes a first terminal coupled to the internal dynamic node 110 and a second terminal coupled to a first terminal of transistor 106. In addition, the gate of each evaluation transistor 104a–104c is coupled to an input $In_0$, $In_1$, and $In_2$, respectively. A second terminal of transistor 106 is coupled to ground and the gate of transistor 106 is coupled to the clock signal 108. Although FIG. 2 illustrates an OR circuit, it should be noted that the evaluation transistors can be configured to form any logic circuit as desired by the circuit developer.

For completeness, the operation of the dynamic OR circuit will be described. As described above, the dynamic wide OR circuit 200 operates using a precharge phase and an evaluation phase. During the precharge phase the clock signal 108 is LOW, which turns transistor 106 OFF and turns the precharge transistor 102 ON, allowing current to flow from $V_{DD}$ to the internal dynamic node 110. As a result, a precharge is provided to the internal dynamic node 110, which goes HIGH. Because transistor 106 is OFF, the internal dynamic node 110 stays high during the precharge phase regardless of the state of the evaluation transistors 104a–104c.

During the evaluation phase the clock signal 108 is HIGH. Hence, transistor 106 is ON and the precharge transistor 102 is OFF, which allows current to flow from the internal dynamic node 110 to ground based on the state of the evaluation transistors 104a–104c. The state of each evaluation transistor 104a–104c depends on the state of the input $In_0$, $In_1$, and $In_2$ coupled to the gate of the particular evaluation transistor 104a–104c. As can be seen in the example of FIG. 2, when the input $In_0$, $In_1$, and $In_2$ of any evaluation transistor 104a–104c is HIGH, the evaluation transistor 104a–104c turns ON and allows current to flow from the internal dynamic node 110 to ground through transistor 106. As a result, the output 112 will be LOW.

However, when all the inputs $In_0$, $In_1$, and $In_2$ of the evaluation transistors 104a–104c are LOW, all the evaluation transistors 104a–104c are OFF and the internal dynamic node 110 is allowed to stay HIGH, resulting in a HIGH at the output 112. As mentioned above, the evaluation transistors 104a–104c leak. Thus, when all the inputs $In_0$, $In_1$, and $In_2$ of the evaluation transistors 104a–104c are LOW, a leakage current is still allowed to flow from the internal dynamic node 110 to ground though transistor 106.

Embodiments of the present invention utilize an adaptive keeper circuit 202 to compensate for the leakage current through the evaluation transistors 104a–104c. The adaptive keeper circuit 202 includes an inverter 204 having an input coupled to the internal dynamic node 110 and an output coupled to the gate of a first keeper transistor 206. A first terminal of the first keeper transistor 206 is coupled to $V_{DD}$ and a second terminal is coupled to the internal dynamic node 110. In addition, the output of the inverter 204 is coupled to the gate of a second keeper transistor 208, which includes a first terminal coupled to $V_{DD}$ and a second terminal coupled to a first terminal of a feedback transistor 210. The second terminal of the feedback transistor 210 is coupled to the internal dynamic node 110, and the gate of the feedback transistor 210 is coupled to a feedback bit 212.

Embodiments of the present invention vary the effective size of the keeper transistor by adding or subtracting the second keeper transistor 208 to the first keeper transistor 206. Control is provided by the feedback bit 212, which is coupled to the gate of the feedback transistor 210. For example, during operation at a normal process corner, the feedback bit 212 is HIGH, which turns the feedback transistor 210 OFF. When the feedback transistor 210 is OFF, the path from the second keeper transistor 208 to the internal dynamic node 110 is disabled. As a result, the second keeper transistor 208 is not added to the first keeper transistor 206. However, during operation at a fast process corner, the feedback bit 212 is LOW, which turns the feedback transistor 210 ON. Consequently, current is allowed to flow from the second keeper transistor 208 to the internal dynamic node 110. As a result, the second keeper transistor 208 is added to the first keeper transistor 206, effectively increasing the size of the keeper transistor.

Thus, the keeper circuit 202 can be used to keep the internal dynamic node 110 HIGH when all the evaluation transistors 104a–104c are OFF. When the internal dynamic node 110 is HIGH, the input of the inverter 204 is HIGH, resulting in a LOW at the output of the inverter 204. The LOW at the output of the inverter 204 turns ON both the first keeper transistor 206 and the second keeper transistor 208. Consequently, the first keeper transistor 206 allows current to flow into the internal dynamic node 110 from $V_{DD}$. In addition, depending on the state of the feedback transistor 210, the second keeper transistor 208 may allow additional current to flow into the internal dynamic node 110 from $V_{DD}$. That is, when the feedback transistor 210 is ON, the second keeper transistor allows additional current is allowed to the internal dynamic node 110. However, when the feedback transistor 210 is OFF, the path from the second keeper transistor 208 to the internal dynamic node 110 is disabled, and current from the second keeper transistor 208 is not added to the internal dynamic node 110.

When the internal dynamic node is LOW, for example because of an evaluation transistor 104a–104c being ON, the keeper circuit 202 turns OFF. Specifically, when the internal dynamic node 110 is LOW, the input of the inverter 204 is LOW, resulting in a HIGH at the output of the inverter 204. The HIGH at the output of the inverter 204 turns OFF both the keeper transistors 206 and 208, which prevents current from flowing into the internal dynamic node 110 from $V_{DD}$, regardless of the state of the feedback transistor 210.

Figure 3:
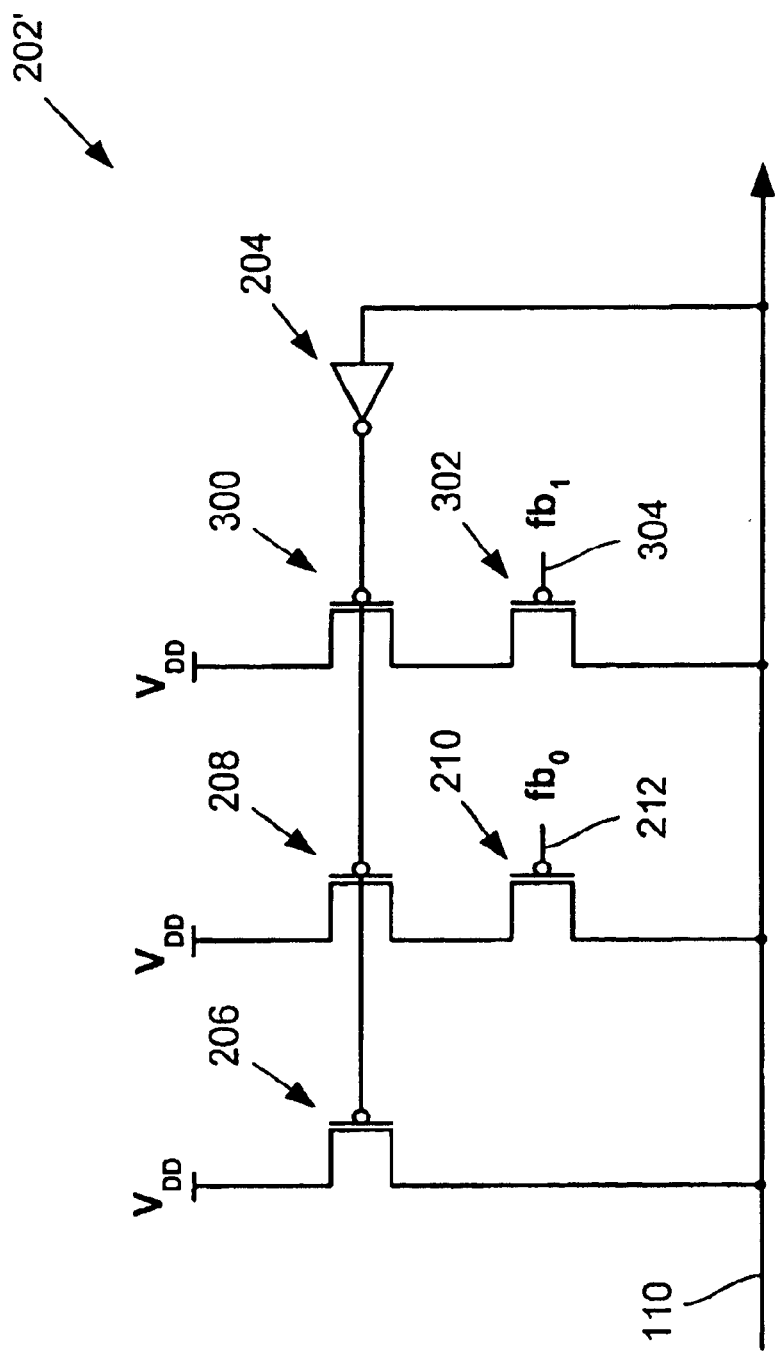
FIG. 3 is a schematic diagram showing a keeper circuit having three keeper transistor paths, in accordance with an embodiment of the present invention.

Additional keeper transistors can be utilized in the keeper circuit 202 of the embodiments of the present invention to provide increased keeper size variation. For example, FIG. 3 is a schematic diagram showing a keeper circuit 202' having three keeper transistor paths, in accordance with an embodiment of the present invention. In this case, control is provided by two feedback bits $fb_0$ 212 and $fb_1$ 304, each coupled to the gate of feedback transistor 210 and feedback transistor 302, respectively.

The additional keeper transistor paths operate in a manner similar to that described with respect to FIG. 2. Specifically, when the feedback bit $fb_0$ 212 is HIGH, feedback transistor 210 OFF, which disables the path from the second keeper transistor 208 to the internal dynamic node 110. Similarly, when the feedback bit $fb_1$ 304 is HIGH, feedback transistor 302 OFF, which disables the path from the third keeper transistor 300 to the internal dynamic node 110. As a result, neither the second keeper transistor 208 nor the third keeper transistor 300 is added to the first keeper transistor 206.

When the feedback bit $fb_0$ 212 is LOW, feedback transistor 210 ON, which allows additional current to flow from the second keeper transistor 208 to the internal dynamic node 110. Similarly, when the feedback bit $fb_1$ 304 is LOW, feedback transistor 302 ON, which also allows additional current to flow from the second keeper transistor 208 to the internal dynamic node 110. As a result, both the second keeper transistor 208 and the third keeper transistor 302 are added to the first keeper transistor 206, thus effectively increasing the size of the keeper transistor. As can be appreciated, various combinations of keeper transistors 208 and 300 can be added to the first keeper transistor 206, depending on the states of the feedback bits $fb_0$ 212 and $fb_1$ 304. For example, when feedback bit $fb_0$ 212 is HIGH and $fb_1$ 304 is LOW, the third keeper transistor 300 will be added to the first keeper transistor 206, while the second keeper transistor 208 will not be added to the first keeper transistor 206.

As above, when the internal dynamic node 110 is HIGH, the input of the inverter 204 is HIGH, resulting in a LOW at the output of the inverter 204. The LOW at the output of the inverter 204 turns ON all the keeper transistors 206, 208, and 300. Consequently, the first keeper transistor 206 allows current to flow into the internal dynamic node 110 from $V_{DD}$ and, depending on the state of the feedback bits $fb_0$ 212 and $fb_1$ 304, additional current may be allowed to flow into the internal dynamic node 110 from $V_{DD}$, as described above.

When the internal dynamic node is LOW, the keeper circuit 202' turns OFF. That is, when the internal dynamic node 110 is LOW, the input of the inverter 204 is LOW, resulting in a HIGH at the output of the inverter 204. The HIGH at the output of the inverter 204 turns OFF all the keeper transistors 206, 208, and 300, which prevents current from flowing into the internal dynamic node 110 from $V_{DD}$, regardless of the state of the feedback bits $fb_0$ 212 and $fb_1$ 304.

As discussed above, embodiments of the present invention can be utilized with as many additional keeper transistors as required by the particular circuit configuration. Moreover, each keeper transistor can itself be different in size to other keeper transistors. For example, the keeper transistors can be weighted in a binary fashion such that the second keeper transistor 208 is twice as large as the first keeper transistor 206, and the third keeper transistor 300 can be twice as large as the second keeper transistor 206. This also applies to the feedback transistors, which can be scaled proportionately to the corresponding keeper transistor. In this manner, each keeper transistor path, which includes a keeper transistor and the feedback transistor coupled to it, can be scaled to obtain a greater number of keeper size combinations using fewer feedback bits.

Figure 4:
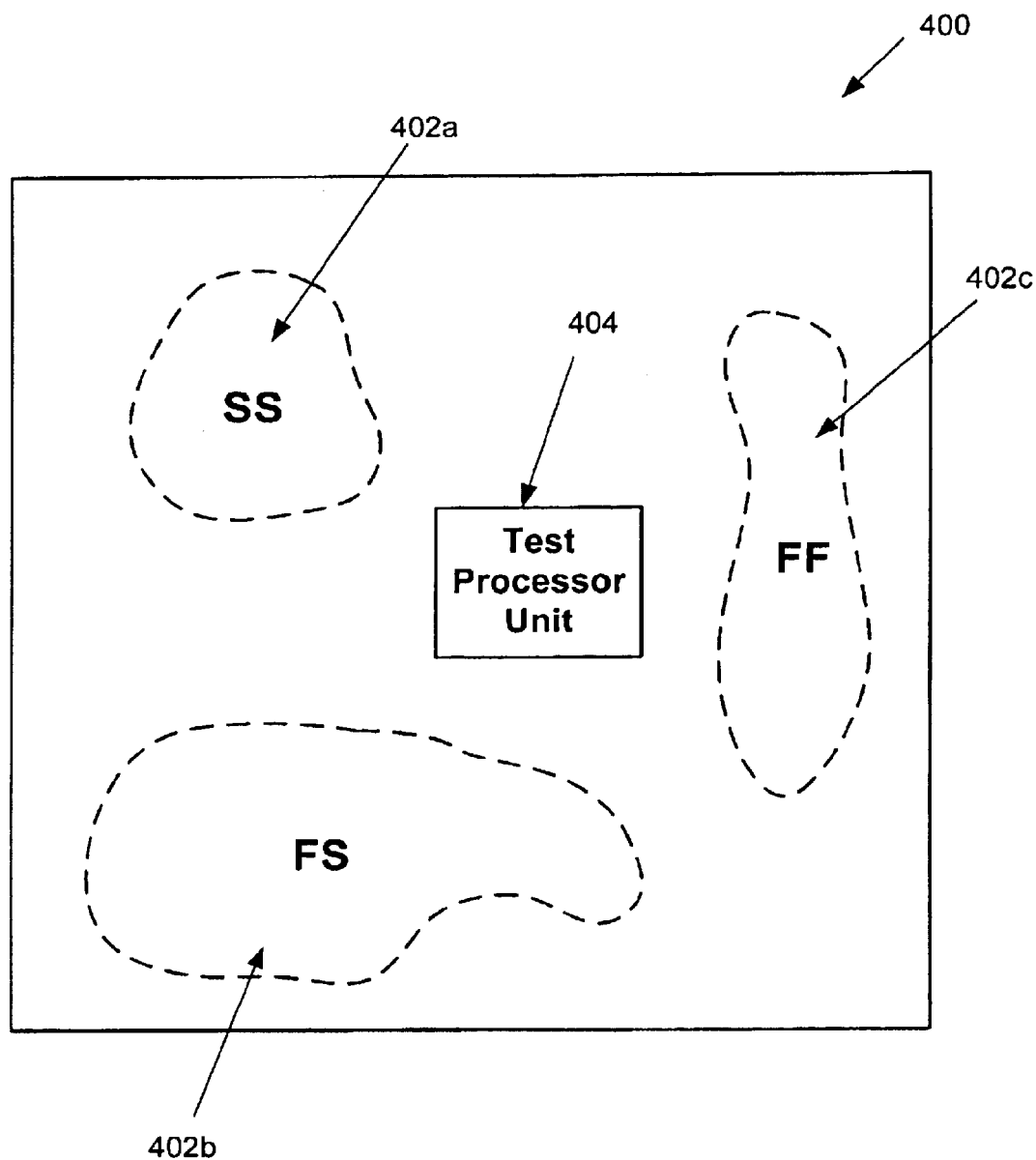
FIG. 4 is a block diagram showing an exemplary die.

As mentioned above, embodiments of the present invention vary the effective size of the keeper transistor based on local process corners of the die. This is accomplished by changing the state of the feedback bits based on local process corners of the die. FIG. 4 is a block diagram showing an exemplary die 400. Depending on the manufacturing process of the die 400, the die 400 can have local die areas 402a–402c that have varying process corners. For example, the exemplary die 400 includes a slow slow local process corner area 402a, a fast slow local process corner area 402b, and a fast fast local process corner area 402c. Although three local process corner areas 402a–402c are illustrated in FIG. 4, it should be noted that a die 400 can include any number of local process corner areas that vary in speed.

Embodiments of the present invention utilize a test processor unit 404 to analyze the various local process corner areas 402a–402c of the die 400 and adjust keeper circuits within these local process corner areas 402a–402c accordingly. Broadly speaking, the test processor unit 404 of the embodiments of the present invention determines bit codes for the feedback bits of the die 400, and provides these codes to each dynamic circuit requiring feedback bit data.

Figure 5:
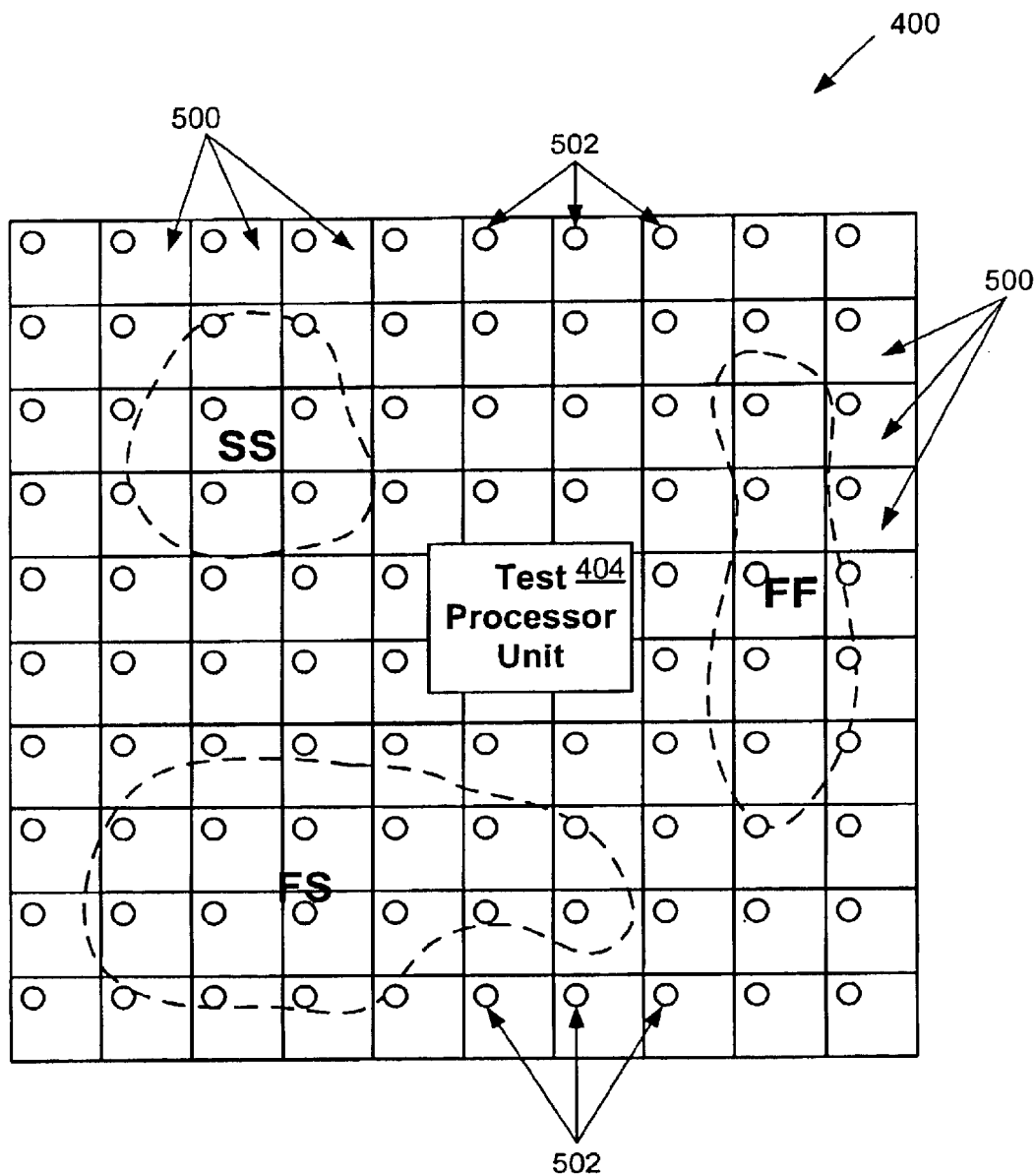
FIG. 5 is a block diagram showing an exemplary die 400 divided into die blocks to facilitate adaptive keeper circuit functionality, in accordance with an embodiment of the present invention

To analyze the local process corners, embodiments of the present invention define a plurality of die blocks across the surface of the die 400, as illustrated in FIG. 5. FIG. 5 is a block diagram showing an exemplary die 400 divided into die blocks to facilitate adaptive keeper circuit functionality, in accordance with an embodiment of the present invention. As shown in FIG. 5, a plurality of die blocks 500 is defined across the surface of the die 400. For example, the die can be divided into one-thousand die blocks 500, ten-thousand die blocks 500, or any other number of die blocks 500 as desired by the user.

A process monitor 502 is positioned within each die block 500 to detect the local process corner. In operation, each process monitor 502 detects process corner data for the local area defined by the corresponding die block 500. As described in greater detail below, each process monitor 502 can be, for example, a ring oscillator or other sensing device capable of determining a process corner rating for a local die block 500. Once detected, the process monitors 502 provide the process corner data to the test processor unit 404, which translates the process corner data into bit codes for use by the keeper circuits of the dynamic circuits of the die 400.

Generally, the translation can be performed utilizing a lookup table that cross-indexes process corner data with corresponding bit codes. For example, if the process monitors 502 classify performance into three process corners such as fast fast (ff), slow fast (sf), and slow slow (ss), an exemplary bit code may be:

| ff | 00 |
| sf | 01 |
| ss | 10 |

Figure 6:
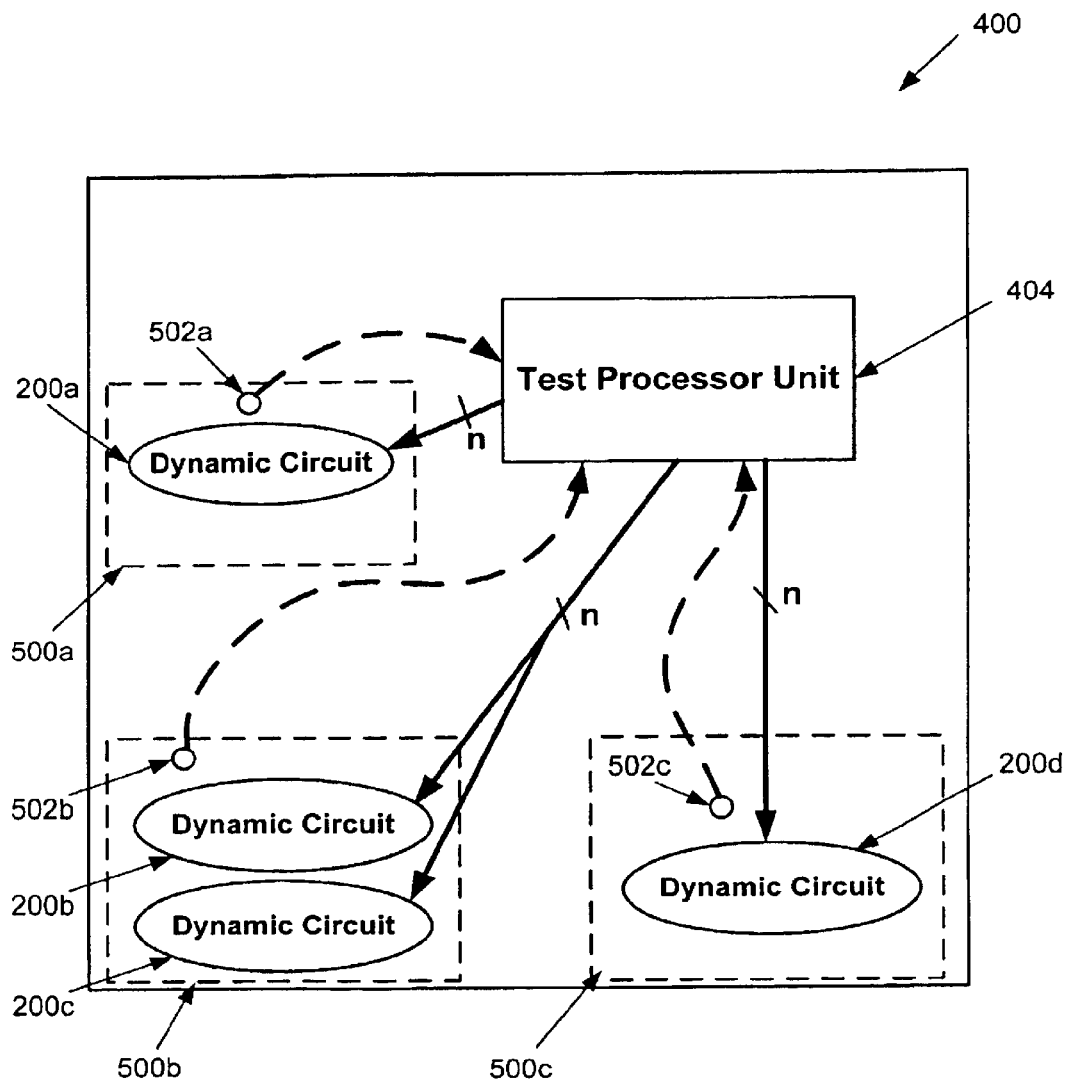
FIG. 6 is a block diagram showing an exemplary die having adaptive keeper circuit functionality, in accordance with an embodiment of the present invention.

Hence, if a particular process monitor 502 provides sf process corner data to the test processor unit 404, the test processor unit 404, in this example, translates the sf process corner data into the bit code "01." The bit code then is provided to the dynamic circuits of the die 400, as illustrated in FIG. 6.

FIG. 6 is a block diagram showing an exemplary die 400 having adaptive keeper circuit functionality, in accordance with an embodiment of the present invention. The die 400 includes a test processor unit 404, which is coupled to a plurality of dynamic circuits 200a–200d and to a plurality of process monitors 502a–502c. In operation, as mentioned above, each process monitor 502a–502c detects process corner data for the local area defined by the corresponding die block 500a–500c. Once detected, the process monitors 502a–502c provide the process corner data to the test processor unit 404, which translates the process corner data into bit codes for use by the keeper circuits of the dynamic circuits of the die 400.

The test processor unit 404 then distributes the translated bit codes to the dynamic circuits 200a–200d corresponding to each process monitor 502a–502c. For example, dynamic circuit 200a receives a bit code based on the process corner data collected by process monitor 500a, which is disposed in the same die block 500a as the dynamic circuit 200a. Similarly, in this example, dynamic circuits 200b and 200c share the same die block 500b, and thus receive a bit code based on the process corner data collected by process monitor 500b in die block 500b.

Generally, each bit in the bit code corresponds to a particular feedback bit. For example, the above bit code "01" can indicate that feedback bit $fb_0$ is HIGH and feedback bit $fb_1$ is LOW, in FIG. 2. In this manner, each dynamic circuit 200a–200d of the die 400 will have its keeper transistor sized appropriately for the process corner of the local die block 500a–500c in which the dynamic circuit resides.

Figure 7:
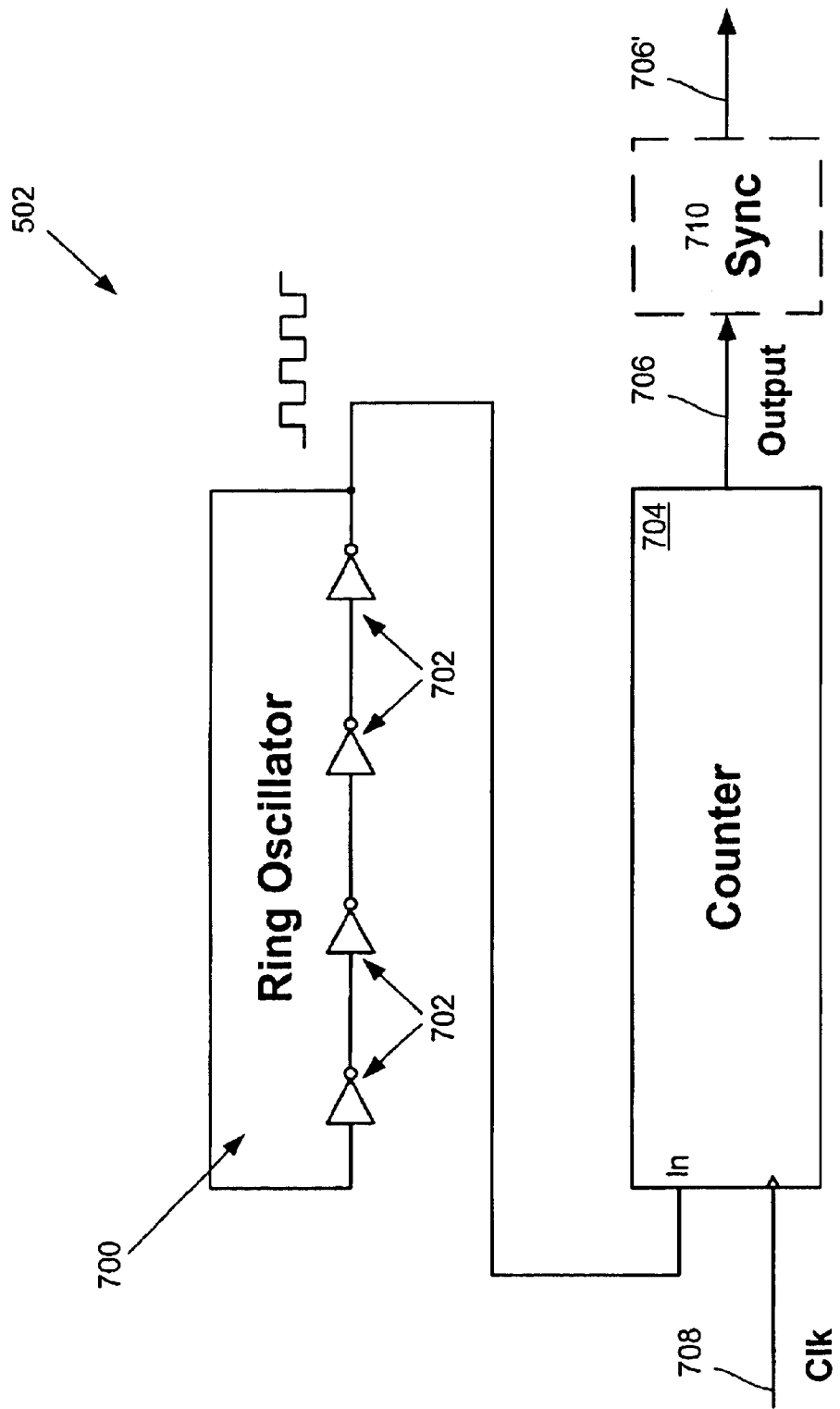
FIG. 7 is a schematic diagram showing an exemplary process monitor based on a ring oscillator, in accordance with an embodiment of the present invention.

FIG. 7 is a schematic diagram showing an exemplary process monitor 502 based on a ring oscillator, in accordance with an embodiment of the present invention. The process monitor 502 includes a ring oscillator 700 coupled to a counter 704, which provides an output signal 706 to the test processor unit. Although the process monitor 502 illustrated in FIG. 7 is based on a ring oscillator, it should be noted that any type of process monitor and/or sensor can be utilized with the embodiments of the present invention.

The ring oscillator 700 comprises a plurality of inverters 702 coupled in series. During operation, the ring oscillator 700 produces a plurality of pulses at a particular frequency. As can be appreciated, the frequency of the pulses is based on the local process corner of the die because of the transistors comprising the inverters 702. That is, the frequency is directly proportional to the current made available for charging or discharging the internal node capacitances, and the current is directly proportional to the local process corner.

The output of the ring oscillator 700 is provided to the counter 704, which converts the pulse frequency into a digital code, using a reference clock 708. Specifically, the counter counts the number of transitions occurring during a particular amount of time. For example, if the ring oscillator frequency is 100 MHz, and the reference clock 708 frequency is 10 MHz, the counter 704 will provide a value of 100 at the output 706 after a sample period. The output of the counter 704 is the process corner data that subsequently is transmitted to the test processor unit for translation into a bit code. Optionally, a synchronization circuit 710 can be utilized to facilitate communication with the test processor unit. For example, the synchronization circuit 710 can be utilized to provide a synchronized output 706', which is synchronized with the test processor unit.

Embodiments of the present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor die having adaptive keeper logic, comprising:
   a plurality of dynamic circuits, each dynamic circuit including an adaptive keeper circuit capable of being adjusted based on a bit code;
   a plurality of process monitors, each process monitor disposed within a corresponding die block defining a local area of the die, each process monitor capable of detecting process corner data for the corresponding die block; and
   a test processor unit in communication with each process monitor and the plurality of dynamic circuits, the test processor unit being capable of obtaining process corner data for each die block from the process monitor disposed within the die block and providing a bit code based on the process corner data to dynamic circuits disposed within the same die block.

2. A semiconductor die as recited in claim 1, wherein each adaptive keeper circuit includes at least one feedback bit line that receives a portion of the bit code, the feedback bit line controlling current flow to an internal dynamic node.

3. A semiconductor die as recited in claim 2, wherein each adaptive keeper circuit further includes a first keeper transistor and at least one secondary keeper transistor in parallel with the first keeper transistor.

4. A semiconductor die as recited in claim 3, wherein the first keeper transistor and the secondary keeper transistor being in electrical communication with a power supply, the first keeper transistor further being in electrical communication with an internal dynamic node.

5. A semiconductor die as recited in claim 4, wherein each adaptive keeper circuit further includes at least one feedback transistor in electrical communication with the at least one secondary transistor, the feedback transistor controlling current flow between the secondary transistor and the internal dynamic node.

6. A semiconductor die as recited in claim 5, wherein the at least one feedback transistor controls current flow between the secondary transistor and the internal dynamic node based on a state of the feedback bit line.

7. A semiconductor die as recited in claim 6, wherein the test processor unit translates the process corer data into the bit code using a lookup function.

8. A method for optimizing a keeper circuit for use in a dynamic circuit, comprising the operations of:
   defining a plurality of die blocks defining a local area of the die;
   obtaining process corner data for each die block;
   translating the process corner data for each die block into a corresponding bit code, the bit code indicating a process corner of the die block; and
   adding particular secondary keeper transistors to a first keeper transistor, the particular secondary keeper transistors being selected using the bit code.

9. A method as recited in claim 8, wherein the secondary keeper transistors are added to the first keeper transistor utilizing corresponding feedback transistors, each feedback transistor having a gate coupled to a bit of the bit code.

10. A method as recited in claim 9, wherein the process corner data is obtained utilizing process monitors, each process monitor being disposed within a corresponding die block.

11. A method as recited in claim 10, wherein each process monitor comprises a ring oscillator coupled to a counter.

12. A method as recited in claim 11, wherein the process corner data is a digital value provided from an output of the counter.

* * * * *